United States Patent [19]
Wattenhofer et al.

[11] Patent Number: 5,936,477
[45] Date of Patent: Aug. 10, 1999

[54] LOW VOLTAGE OPERATED OSCILLATOR USING TRANSISTORS WITH FORWARD BIASED SOURCE-TUB JUNCTIONS

[75] Inventors: Jean-Pierre Wattenhofer; Pierre-André Farine, both of Neuchâtel, Switzerland

[73] Assignee: Asulab, S.A., Bienne, Switzerland

[21] Appl. No.: 08/996,512

[22] Filed: Dec. 23, 1997

[30] Foreign Application Priority Data

Jan. 9, 1997 [CH] Switzerland ............................. 0032/97

[51] Int. Cl.⁶ ............................. H03B 5/02; H03K 3/354
[52] U.S. Cl. .............................................. 331/57; 331/185
[58] Field of Search ............................. 331/57, 116 FE, 331/117 FE, 185

[56] References Cited

U.S. PATENT DOCUMENTS

| | | | |
|---|---|---|---|
| 3,855,549 | 12/1974 | Huener et al. | 331/108 D |
| 4,388,536 | 6/1983 | Peil et al. | 307/268 |
| 5,017,811 | 5/1991 | Worley | 307/475 |
| 5,239,274 | 8/1993 | Chi | 331/57 |
| 5,302,920 | 4/1994 | Bitting | 331/57 |

FOREIGN PATENT DOCUMENTS 0 022 266  1/1981  European Pat. Off. .

OTHER PUBLICATIONS

IEEE Transactions on Electron Devices, vol. 43, No. 6, Jun. 1996, pp. 904–909, XP000636245 Chen M–J et al: "Back–Gate Forward Bias Method for Low–Voltage CMOS Digital Circuits".

*Primary Examiner*—Siegfried H. Grimm
*Attorney, Agent, or Firm*—Griffin, Butler, Whisenhunt & Szipl, LLP

[57] ABSTRACT

An oscillator, such as a ring oscillator, uses CMOS transistors. At least some of the transistors have forward biased, current limited source-tub junctions for lowering the threshold voltages of these transistors. This enables the oscillator to operate at very low supply voltages, and it may be used in an electronic timepiece powered by a single photovoltaic cell.

13 Claims, 4 Drawing Sheets

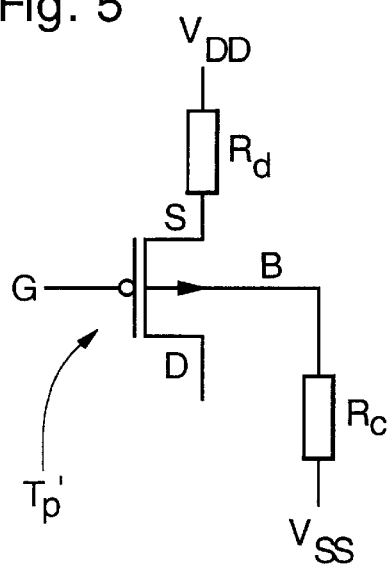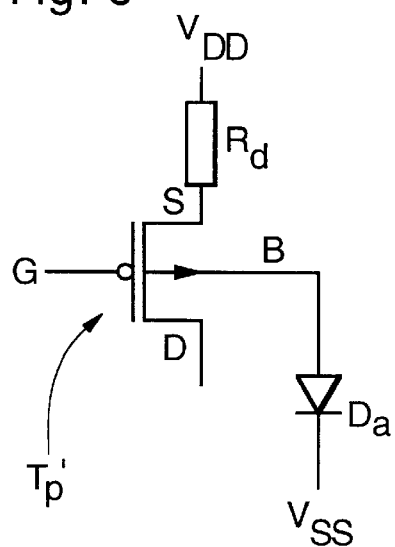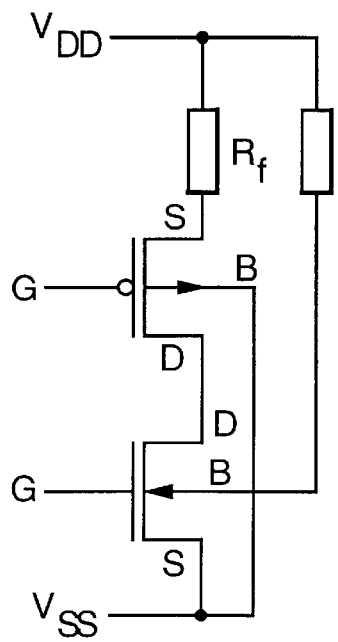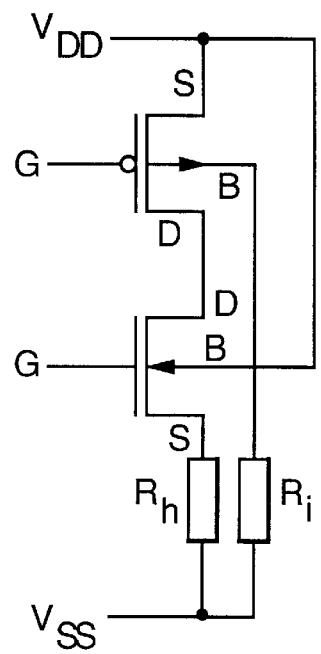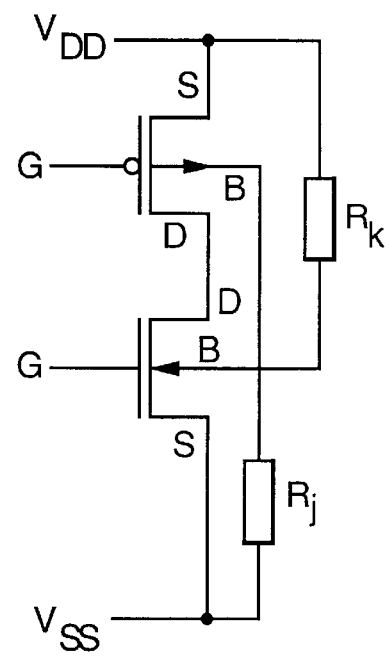

Fig. 11
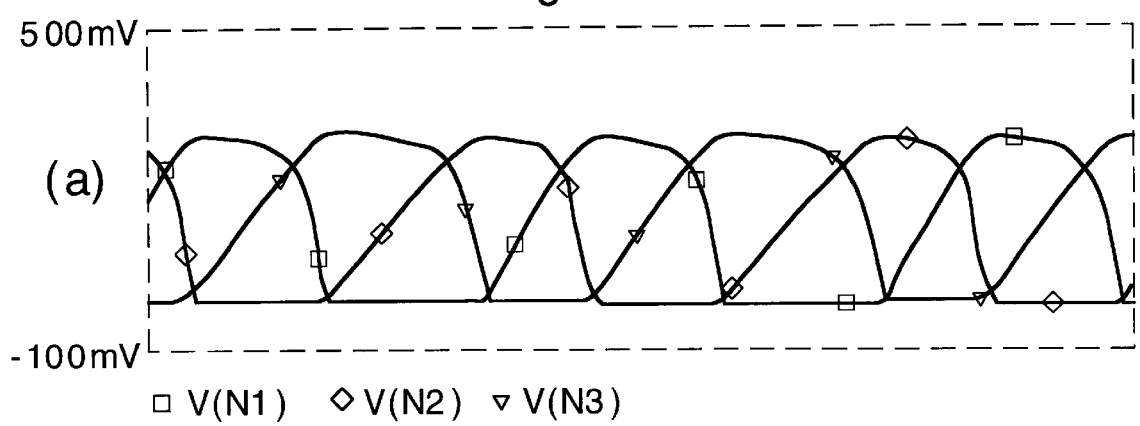
(a)
□ V(N1)  ◇ V(N2)  ▽ V(N3)
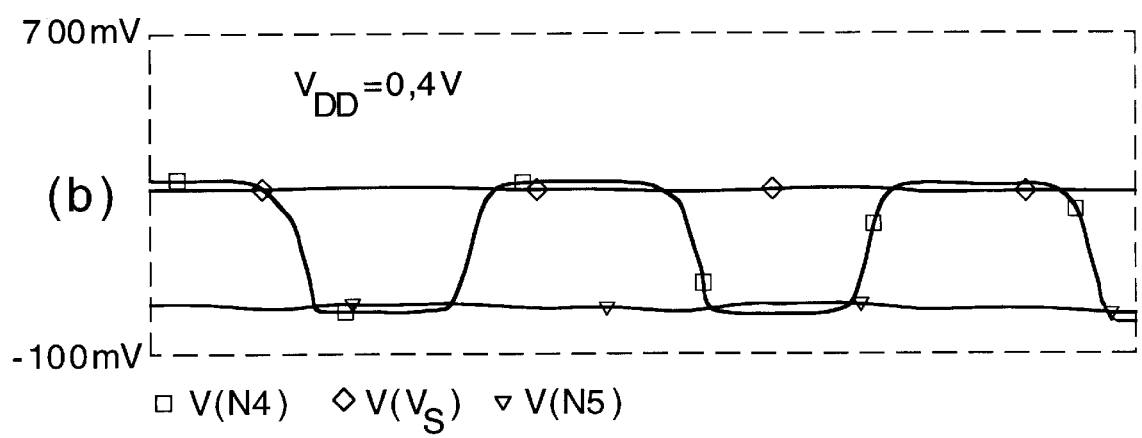
(b) $V_{DD}=0.4V$
□ V(N4)  ◇ V($V_S$)  ▽ V(N5)
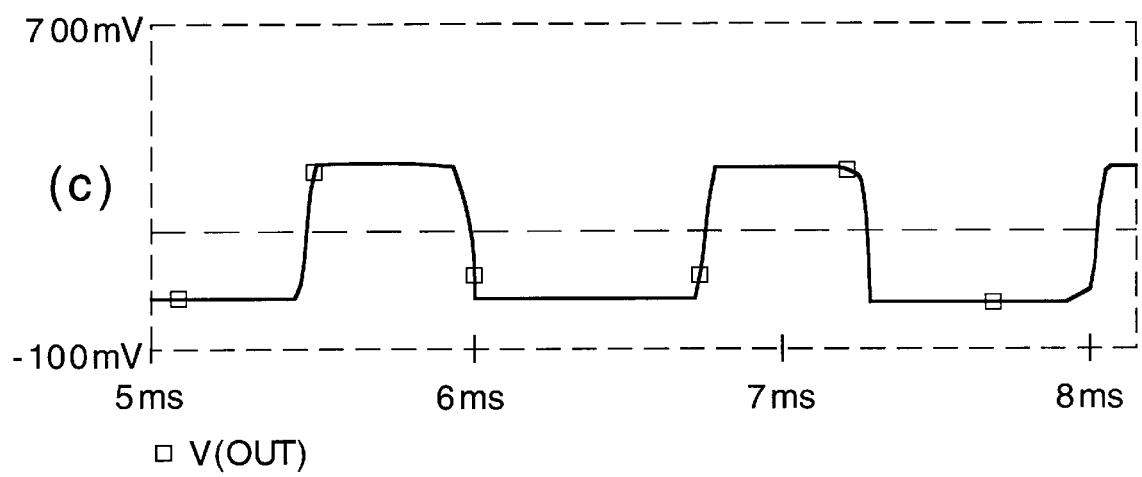
(c)
□ V(OUT)

LOW VOLTAGE OPERATED OSCILLATOR USING TRANSISTORS WITH FORWARD BIASED SOURCE-TUB JUNCTIONS

The present invention concerns an oscillator operating with a very low voltage power supply.

More precisely, the invention concerns a CMOS technology oscillator which may be powered by a voltage coming from an energy source having a voltage of not more than 0.4 to 0.5 V.

Such an energy source may be formed for example of a photovoltaic cell of which, in certain cases, only one may be used in a same apparatus. This is the case for example in certain timepieces, such as solar watches, which for reasons of costs and aesthetics, are advantageously equipped with only one single photovoltaic source.

However, in such an application, the power supply voltage of the components of the integrated circuit ensuring the operation of the apparatus, must be at least 1 V so that a voltage booster must be used to convert the voltage of around 0.4 V of the photovoltaic source into a voltage situated typically around 1.2 to 1.3 V. Such a voltage booster advantageously comprises an induction coil which is alternatively switched to short-circuit it and to a large capacity accumulator, the switching being driven by an oscillator. This oscillator must thus be able to function, if only so as to start the apparatus after having being placed for a long time in the dark, at a supply voltage which can not be more than that of the single photovoltaic source.

For more details concerning such a voltage booster and its associated control circuit, reference is made to co-pending European patent application No 97100238.1 in the name of the present Applicant. It should however be noted that the present invention is not limited to the application given briefly hereabove, but that it may, on the contrary, find an application where, in an apparatus obtained by CMOS technology, the use of an oscillator is necessary, although the power supply voltage available is less than the threshold voltage of the MOS transistors used by the integrated circuit of this apparatus.

The invention thus has as its object to provide an oscillator realised in CMOS technology functioning with a very low voltage power supply.

The invention thus concern an oscillator realised in CMOS technology functioning with a very low voltage power supply characterized in that the oscillator comprises:

means for biasing in the forward sense the source-tub junction of at least some of its transistors, and means for limiting the current passing through this junction.

Thanks to these features, at least some transistors composing the oscillator may function with a reduced threshold voltage which allows to lower their supply voltage.

Other features and advantages of the invention will appear more clearly from the following description which is given solely by way of example and with reference to the annexed drawings in which:

FIGS. 5 to 9 show other possible assemblies to ensure the tub biasing;

FIG. 11 shows several signal diagrams which appear in the oscillator represented in FIG. 10.

FIG. 1 represents a cross-section of an N-channel MOS transistor using an N-type substrate technology with a P-type tub, the following notation will be used:

A-substrate, B-tub, D-drain, G-gate, S-source, $V_{DD}$-positive power supply connection. The theory of such a CMOS transistor shows that if one wants to make it operate with a very low threshold level, it suffices to have it operate in the low inversion field. This may be obtained in particular by appropriately determining the size of the transistor and in particular its width (indicated by W by the specialists). An increase of this parameter W causes an increases of the drain current $I_D$ according to the well-known formula:

$$I_D = (I_O * W/L) * \exp(V_G/nU_T) * (\exp(-V_S/U_T) - \exp(V_D/U_T))$$

in which:

W—width of the transistor

L—length of the transistor $V_G$—gate voltage $V_S$—source voltage $V_D$—drain voltage $U_T$—thermodynamic voltage The formula given hereabove shows that the current $I_D$ may be increased not only by increasing the parameter W. but also by acting on the voltage $V_S$, the voltages $V_G$ and $V_D$ being determined by the available power supply voltage $V_{DD}$-$V_{SS}$.

Figure 1:
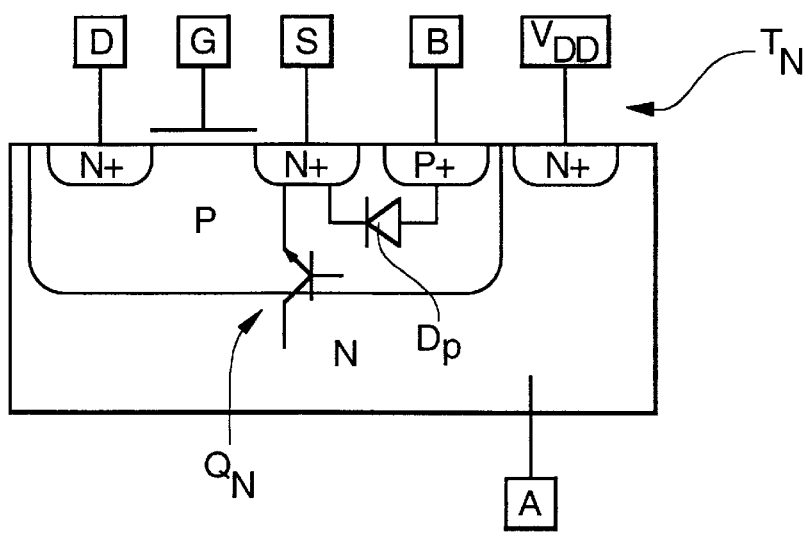
FIG. 1 is a schematic cross-section of an N-channel transistor of the technology having an N-type substrate and a P-type tub.

FIG. 1 also shows that the N-channel transistor using an N-type substrate technology having an P-type tub, has parasite elements which may be symbolised by a diode $D_p$ connected between the source S and base B and by a bipolar transistor $Q_N$ having its collector formed by substrate A, its emitter formed by the source S and its base by the tub B. These parasite elements lead designers of CMOS integrated circuits to maintain the voltage $V_S$ at a positive value or at zero so as to avoid that the current in these parasite elements becomes too great.

The present invention is based on the concept that to a certain level biasing of the junction between the source S and the tub B is possible (that is the diode $D_p$) by applying a higher voltage to tub B than is applied to source S and by providing at the same time means for limiting the current in the junction between source S and tub B to a certain value.

Figure 2:
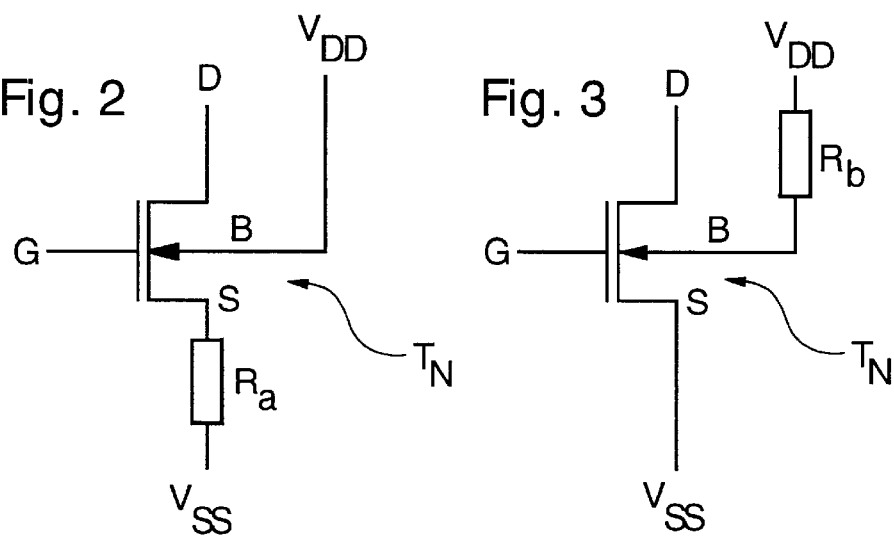
FIGS. 2 and 3 show two tub biasing diagrams for the transistor represented in FIG. 1.
Figure 3:
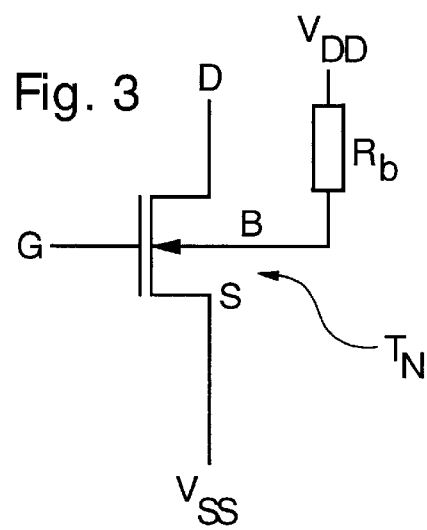

An assembly showing the principle of carrying out this concept can be seen in FIG. 2. It shows transistor $T_N$ represented in FIG. 1 having its tub B connected to voltage $V_{DD}$ and having its source S connected to voltage $V_{SS}$ by the intermediate of current limitation means which is in this case a resistance $R_A$. FIG. 3 shows an alternative of this assembly in which the current limitation means is constituted by a resistance $R_B$ connected between tub B and voltage $V_{DD}$.

In the CMOS technology with an N-type substrate and a P-type tub, the tub of a P-channel transistor is in fact the substrate, such as substrate A in FIG. 1. This substrate is common for the whole circuit and it is connected to the most positive voltage ($V_{DD}$). In these conditions, it is not possible to bias the source at a voltage higher than that of the substrate. This is not a major inconvenience, because in this technology, the threshold voltages of P-type transistors are generally much lower than those of N-type transistors, so that it is not necessary to provide particular measures concerning P-type transistors in this case if the power supply voltage is low.

Figure 4:
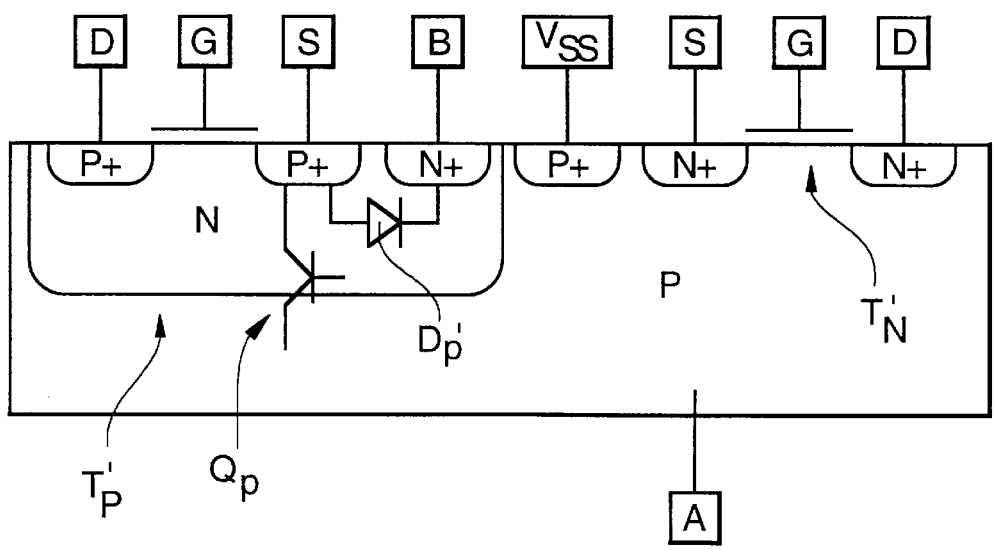
FIG. 4 is a cross-section of two transistors which are P-channel and N-channel respectively in the technology of a P-type substrate and an N-type tub.

FIG. 4 shows a cross-section of two transistors side-by-side of CMOS technology in a P-type substrate with an N-type tub and with a P-type transistor $T_P'$, and an N-type transistor $T_N'$. The remarks concerning the complimentary case as mentioned hereabove, are also applicable here with the condition of inverting the voltage polarities. Furthermore, in this case the dimensions of the transistor are not identical because of the dissymetry of the mobility of the charge carriers which is larger for N-channel transistors than for P-channel transistors.

Thus, the case of transistor $T_P'$ according to FIG. 4 is shown in FIG. 5 with its tub B connected to potential $V_{SS}$ by the intermediate of a resistance $R_C$ thus forming a first part of the current limitation means and being connected between tub B and potential $V_{SS}$. The second part of these means may be formed by another resistance $R_D$ connected between the potential $V_{DD}$ and the source of this P-type transistor $T_P'$.

FIG. 6 shows an alternative of an assembly of FIG. 5, in which the resistance $R_D$ is replaced by a diode $D_A$ connected in the forward direction between tub B and potential $V_{SS}$.

It is also possible to apply the concept of the invention to the so called twin-well technology according to which each of these two types of transistors may be located in individual tubs in the same substrate. It is thus possible to bias the two types of tubs according to the diagrams represented respectively in FIGS. 7, 8 and 9 showing different possibilities of implementing current limitation means vis-a-vis these transistors, these means being formed respectively by resistances $R_F$ and $R_J$, $R_H$ and $R_I$ and $R_J$ and $R_K$.

Figure 10:
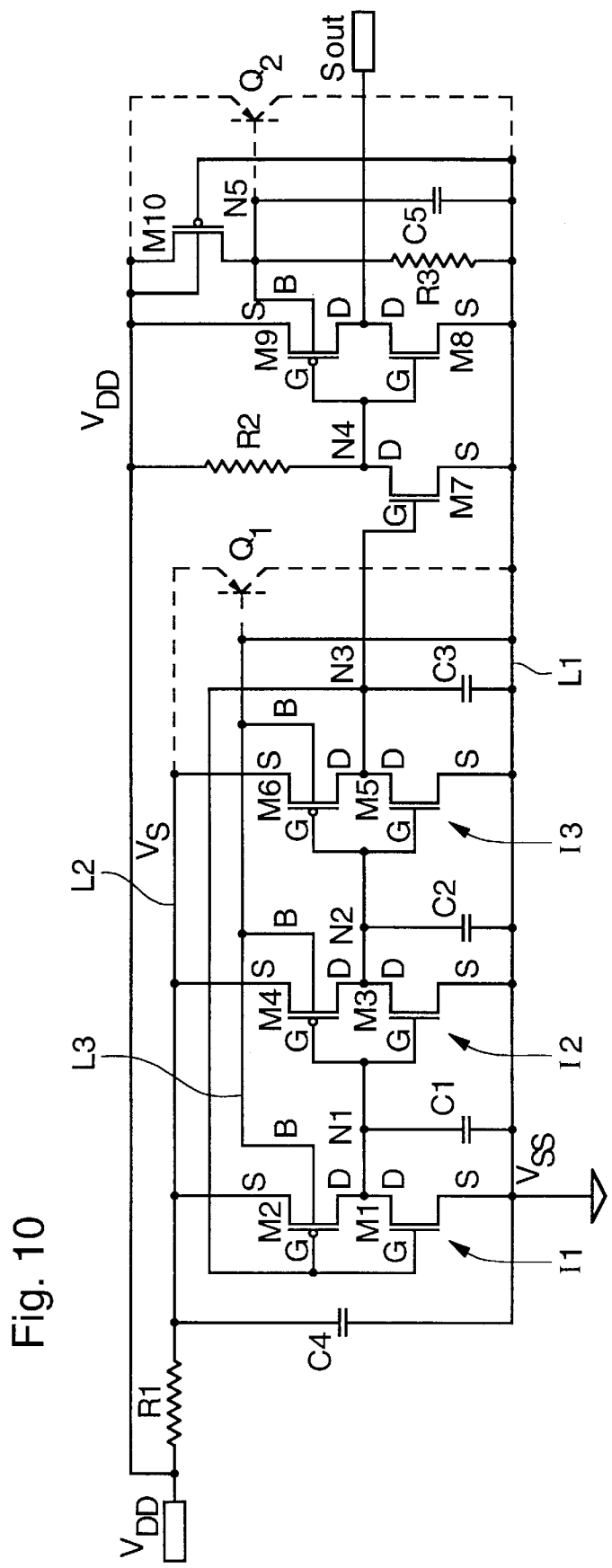
FIG. 10 is a diagram of an oscillator obtained according to the concept of the invention.

FIG. 10 represents an example of an embodiment of an oscillator conceived on the basis of the concept described hereabove, the diagram adopted to lower the threshold voltage being identical to that of FIG. 5 by omitting however the resistance $R_C$, and the configuration of the structure of the transistors used being that of FIG. 4.

The chosen concept for this oscillator is the diagram of a ring oscillator comprising three inverters I1, I2 and I3 arranged in a cascade, each inverter being obtained by associating two complementary transistors M1–M2, M3–M4 and M5–M6, respectively. In each inverter, the source-drain path of the transistors is connected in series between each other and between a voltage supply line L1 to which is applied voltage $V_{SS}$ and a voltage supply line L2 having a voltage $V_S$.

The gates of transistors M1 and M2 are connected by a feedback loop to a node N3 which is the common drain connection of transistors M5 and M6. The common drain connection of transistors M1 and M2 forms a node N1 which is connected to the gates of transistors M3 and M4. The common drain connection M3 and M4 forms a node N2 which is connected to the gates of transistors M5 and M6.

Nodes N1, N2 and N3 are further connected to the voltage power supply line L1 by the intermediate of capacitors C1, C2 and C3 respectively.

The tubs B of the P-type transistors of this assembly are all connected to a line L3 which is connected to power supply line L1. Furthermore, the line L2 is connected to the power supply $V_{DD}$ by the intermediate of a resistance R1 which, in the case of the present invention, acts as the current limitation means for all three P-type transistors M2, M4 and M6 of the assembly. The voltage stabilising capacitor C4 connects the lines L1 and L2 to each other.

The combination of resistance R1 and of capacitor C4 reduces somewhat the amplitude at the output of the oscillator as such (node N3). In certain cases, and in particular in the case of the application described hereabove in which the oscillator must be controlled by a voltage booster, it may be desirable to add to this assembly, on the one hand, a level-shift circuit formed here by an N-channel transistor M7 and a resistance R2 and, on the other hand, a drive circuit formed of the N-channel transistor M8 and the P-channel transistor M9.

The gate of transistor M7 is connected to node N3, whereas its source-drain path is connected in series with resistance R2 between terminal $V_{DD}$ and line L1, the common point forming a node N4.

The gates of transistors M8 and M9 of the drive circuit are connected to each other and to node N4. Their source-drain paths are connected in series between the terminal $V_{DD}$ and line L1. The drains of transistors M8 and M9 constitute the output $S_{OUT}$ of the assembly. Furthermore, it should be noted that the tub of transistor M9 is connected to line L1 by the intermediate of a resistance R3 connected in parallel to a capacitor C5. This connection biases the tub-source junction of transistor M9 so as to lower its threshold value as is the case with transistors M2, M4 and M6.

It should also be noted that in the diagram of FIG. 10, the parasite transistors Q1 and Q2 are represented which correspond to the transistor $Q_P$ represented in the cross-section of FIG. 4. Transistor Q1 is not cumbersome, because it acts as a diode connected in parallel to these tub-source junctions of transistors M2, M4 and M6.

As for transistor Q2, it constitutes a direct conduction path between the line L1 and terminal $V_{DD}$. It is thus preferable to provide a supplementary P-type transistor M10 in case the voltage $V_{DD}$-$V_{SS}$ might rise above 0.6 V in certain circumstances. Indeed, the current of this transistor Q2 is not very high for a low voltage supply, lower than 0.5 V. However, for higher voltages, this current increases strongly.

The source-drain path of transistor M10 is connected in series with a resistance R3 between terminal $V_{DD}$ and the line L1 to which its gate is also connected. Node N5 which is between the drain of this transistor M10 and resistance R3 is connected to tub B of transistor M9. Tub B of transistor M10 is on the contrary connected to terminal $V_{DD}$. Thus, as soon as the voltage $V_{DD}$ goes beyond the conduction threshold of transistor M10, it connects the tub of transistor M9 to terminal $V_{DD}$ thus suppressing the conduction through the transistor Q2.

In a variant of the diagram described herebefore, the current limitation means of transistors M2, M4 and M6 are connected between their tubs B and the line L1, as has been done for transistor M9. In this case, it is possible to avoid the use of the level-shift transistor M7. However, such a variant need hardly be used if the supply voltage varies between 0.4 and 0.6 V, because in this case, the frequency of the oscillator could vary very strongly (typically by a factor 75), whereas in the assembly represented in FIG. 10, this variation of frequency would not be more than a factor 4 for a same variation of the supply voltage.

Clearly, the solutions shown in FIGS. 6 to 9 may also be used for a realisation of the oscillator.

It should be noted that the arrangement of FIG. 6 is advantageous because it allows to obtain an increase of 15 to 20% of the amplitude of the output signal with respect to the amplitude of the signal obtained at node N3 in FIG. 10.

FIG. 11 represents several wave forms a, b and c as a function of time of the signals obtained at several points of the circuit in FIG. 10.

What is claimed is:

1. An oscillator realised in CMOS technology functioning with a low supply voltage wherein it comprises:

means for biasing in the forward sense the source-tub junction of at least some of its transistors, and comprising means for limiting the current flowing across this junction.

2. An oscillator according to claim 1, wherein said current limitation means comprise at least one resistance connected in series with said biasing means between the power supply terminals of the oscillator.

3. An oscillator according to claim 2, wherein a single resistance is connected to the source of the transistor.

4. An oscillator according to claim 3, wherein two resistances are connected respectively to the source and to the tub of said transistor.

5. An oscillator according to claim 1, wherein said current limitation means comprise a diode.

6. An oscillator according to claim 1, wherein said current limitation means are the same for several transistors of the same conductivity type.

7. An oscillator according to claim 6, wherein said current limitation means are connected in series with a capacitor between the power supply terminals of the oscillator.

8. An oscillator according to claim 1, wherein it comprises three inverters connected in cascade, and in a feedback loop and each being formed by a pair of complementary transistors.

9. An oscillator according to claim 8, wherein for each pair of complementary transistors, the source-tub junction of the transistor of the same type as the substrate is biased in a forward sense.

10. An oscillator according to claim 8, wherein the last of said inverters is connected to a level shift assembly so as to increase the output and amplitude of the oscillator.

11. An oscillator according to claim 8, wherein it also comprises a drive circuit for increasing the output current of the oscillator.

12. An oscillator according to claim 11, characterized in that said drive circuit comprises a pair of complementary transistors at least one of which has a source-tub junction biased in the forward sense.

13. An oscillator according to claim 12, wherein it further comprises a switching transistor for rendering inoperable said forward biasing of the transistors of the drive circuit when the supply voltage across said terminals passes a predetermined value.

* * * * *